United States Patent
Hausner et al.

(10) Patent No.: US 9,935,077 B2
(45) Date of Patent: Apr. 3, 2018

(54) APPARATUS FOR EUTECTIC BONDING

(71) Applicant: Robert Bosch GmbH, Stuttgart (DE)

(72) Inventors: Ralf Hausner, Reutlingen (DE);
Andreas Duell, Stuttgart (DE);
Johannes Baader, Wannweil (DE);
Rainer Straub, Ammerbuch (DE)

(73) Assignee: ROBERT BOSCH GMBH, Stuttgart (DE)

( * ) Notice: Subject to any disclaimer, the term of this patent is extended or adjusted under 35 U.S.C. 154(b) by 525 days.

(21) Appl. No.: 14/620,952

(22) Filed: Feb. 12, 2015

(65) Prior Publication Data
US 2015/0235982 A1    Aug. 20, 2015

(51) Int. Cl.
*B23K 1/00* (2006.01)
*H01L 23/00* (2006.01)

(52) U.S. Cl.
CPC ............ *H01L 24/741* (2013.01); *H01L 24/29* (2013.01); *H01L 24/32* (2013.01); *H01L 24/80* (2013.01); *H01L 24/83* (2013.01); *H01L 2224/26145* (2013.01); *H01L 2224/26175* (2013.01); *H01L 2224/29011* (2013.01); *H01L 2224/29013* (2013.01); *H01L 2224/29117* (2013.01); *H01L 2224/29124* (2013.01); *H01L 2224/3205* (2013.01); *H01L 2224/32225* (2013.01); *H01L 2224/32502* (2013.01); *H01L 2224/32506* (2013.01); *H01L 2224/749* (2013.01); *H01L 2224/80* (2013.01); *H01L 2224/83007* (2013.01); *H01L 2224/83193* (2013.01); *H01L 2224/83203* (2013.01); *H01L 2224/83805* (2013.01); *H01L 2924/1461* (2013.01); *Y10T 403/479* (2015.01)

(58) Field of Classification Search
CPC . B23K 20/021; B23K 2201/36; B23K 1/0016
USPC .......... 228/175; 257/E21.499, 704, E21.504, 257/E23.125; 438/106, 127, 51
See application file for complete search history.

(56) References Cited

U.S. PATENT DOCUMENTS

2015/0001280 A1*   1/2015   Nakagawa   ............ B23K 20/026
                                                       228/164

FOREIGN PATENT DOCUMENTS

DE      102011077933     12/2012
WO      WO-2013129281 A1 *  9/2013   ............ B23K 20/026

* cited by examiner

*Primary Examiner* — Erin B Saad
(74) *Attorney, Agent, or Firm* — Norton Rose Fulbright US LLP; Gerard Messina

(57) ABSTRACT

An apparatus for eutectic bonding includes (a) a bonding frame that includes two substrates and (b) a frame device situated on the substrates, the frame device including two frames, the apparatus being usable to develop a eutectic, formed during bonding, in a spatially defined manner, whereby a volume formed by the frames and the substrates can be filled up completely with the eutectic.

8 Claims, 2 Drawing Sheets

APPARATUS FOR EUTECTIC BONDING

FIELD OF THE INVENTION

The present invention relates to a device and method for eutectic bonding.

BACKGROUND

Micromechanical sensors are hermetically closed, as a rule, by a wafer bonding process, in order to protect the sensors from environmental influences (such as dust, moisture, gas etc.) and to enclose certain gases or a vacuum. In this instance, various wafer bonding methods have become established, such as eutectic bonding, glass frit bonding, and thermocompression bonding.

In eutectic bonding, a possible material combination is aluminum and germanium, which are typically respectively deposited on a sensor wafer and cap wafer.

In comparison to glass frit bonding, the space requirement in eutectic bonding for a hermetic and mechanically firm connection is clearly lower, based on the overall lower material quantity of the "joining material." However, upon melting, the eutectic material becomes liquid, and therefore requires lateral distances from active and movable structures, so that, in this way, disadvantageously, a relatively large space has to be kept in reserve.

German Document DE 10 2011 077 933 A1 describes a method for bonding two substrates, particularly in the production of eutectically bonded semiconductor components having microelectromechanical patternings.

SUMMARY

It is an object of the present invention to provide an improved device for eutectic bonding of two substrates.

According to a first aspect, the object is attained, in an example embodiment, using a device for eutectic bonding, the device including (a) a bonding frame that includes two substrates, and (b) a frame device situated on the substrates, the frame device including two frames by the use of which a eutectic formed during bonding is able to be formed in a spatially defined manner, whereby a volume formed by the frames and the substrates is able to be filled completely with eutectic.

Using the frame device, a locally controlled expansion of the liquid eutectic or a limited conversion of the eutectic upon into a fluid by melting during the wafer bonding process is provided. In this way, for instance, micromechanical components are able to be constructed in a substantially more space-saving manner, whereby miniaturization of the components is advantageously supported.

According to a second aspect, the object is attained by a method that uses a device for eutectic bonding, where the method, according to an example embodiment, includes: applying a first bonding layer on a first substrate; applying a second bonding layer on a second substrate, at least one of the substrates including a frame device that encloses the two bonding layers; heating up the substrate composite; and exerting a mechanical pressure on the substrate composite in such a way that a volume formed by the frame device and the substrates is completely filled up with eutectic.

In an example embodiment, the frame device includes an inner frame and an outer frame by which a ring-type development of the eutectic can be formed, which advantageously enables a lower space requirement of the component with the substrates.

In an example embodiment, a height of the frame is specifically developed to be smaller than a combined height of bonding layers for the eutectic. This supports the above-mentioned volume being able to be completely filled up with eutectic. As a result this means an optimum connecting strength of the two substrates of the component.

In an example embodiment, the outer frame, on at least one outer side, includes at least one opening for the outflow of eutectic. Excess eutectic can move outwards in a specified way through this opening into a region that is without importance for the component, whereby damage from the exiting eutectic is avoided.

In an example embodiment, the outer frame, on more than one outer side, in particular, at each outer side, includes at least one opening for the outflow of eutectic. In this way, an output quantity of the eutectic can be dimensioned by the number of openings.

In an example embodiment, the frames are formed of one of the following materials: oxide, nitride, titanium. Thus, advantageously, several possibilities for a material selection of the frames can be taken into consideration.

In an example embodiment, the openings have a diameter of ca. 10 μm to ca. 20 μm.

In an example embodiment, the inner frame for the eutectic is developed to be fluid-tight so that an inner region of the inner frame, in which sensitive micromechanical patterns can be situated, are advantageously protected from exiting eutectic during the eutectic bonding process.

In the following text, the present invention is described in detail together with additional advantages and features, using several figures. In this context, all the features described form the subject matter of the present invention, independently of their representation in the description and in the figures, in which the same or functionally the same elements bear the same reference symbol.

DETAILED DESCRIPTION

Figure 1:
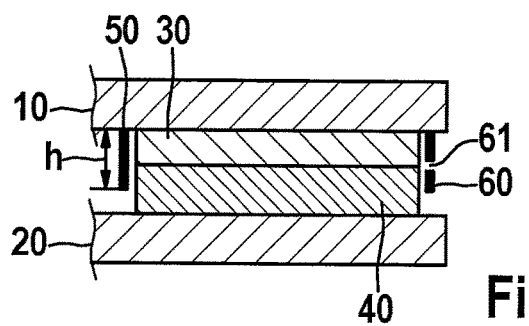
FIG. 1 is a cross sectional view through a subsection of an apparatus, according to an example embodiment of the present invention.
Figure 3:
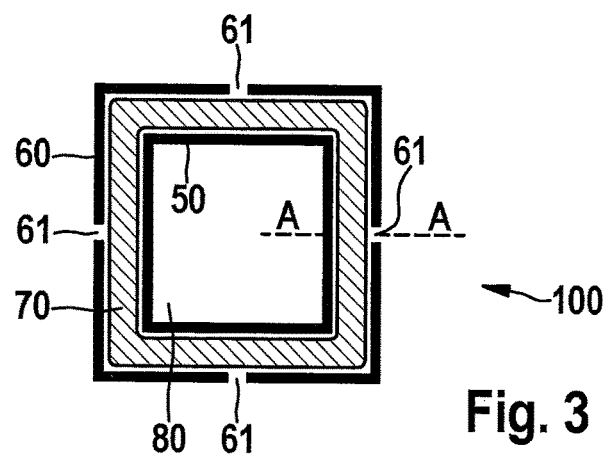
FIG. 3 a top view of the apparatus according to an example embodiment of the present invention.

FIG. 1 shows a cross sectional view along a section A-A of FIG. 3 through a semiconductor component before a eutectic wafer bonding process. In this context, a first substrate 10 (e.g., a cap wafer) is to be eutectically connected to a second substrate 20 (e.g., a sensor wafer). For this purpose, a first bonding layer 30 (e.g., germanium) is applied on first substrate 10, and a second bonding layer 40 (e.g., aluminum) is applied to second substrate 20. Subsequently, the entire system is heated, and a mechanical pressure is exerted upon substrates 10, 20, whereby the two bonding layers 30, 40 liquify to form eutectic material 70.

Usually, essentially fluid eutectic 70 flows out laterally between substrates 10, 20 and thereby requires much reserved space on substrates 10, 20. As a result, the two substrates 10, 20 are connected to each other eutectically using a eutectic connection of the two bonding layers 30, 40.

According to the present invention, a specified geometric form of liquid eutectic 70 is enabled by an apparatus 100 that includes an inner frame 50 and an outer frame 60, in which outer frame 60 there is at least one opening 61 via which excess eutectic 70 can flow off outwards. It is preferably provided that at least one opening 61 is situated at each outer side of outer frame 60, so that a symmetrical exiting of excess eutectic 70 is supported. The illustration of opening 61 in FIG. 1 should only be understood to be qualitative, while, based on etching technology requirements, openings 61 are developed in the vertical direction from top to bottom. It has been discovered that, for a specified flowing off of eutectic 70, a diameter of opening 61 of the order of magnitude of ca. 10 µm to ca. 20 µm is favorable.

Inner frame 50 is designed to be fluid-tight to eutectic 70, so that eutectic 70 can exit into a cavity 80 that is to be protected and in which micromechanical sensor patterns (not shown) are able to be situated. As a result, a delicate sensor core or an inner region of inner frame 50, that is to be protected, is able to be protected from eutectic 70 becoming fluid.

Frames 50, 60 provide, in this way, a spatial limitation for eutectic 70, so that, as a result, a space-saving embodiment of the bonding frames is possible, whereby the entire micromechanical component may be designed in a very space-saving manner.

A height 'h' of inner frame 50 and outer frame 60 is preferably a little less than a combined height of the two bonding layers 30, 40, so that after the application of mechanical pressure on substrates 10, 20 using frames 50, 60, frames 50, 60 are conclusively connected to substrates 10, 20.

One material of frames 50, 60 is preferably an oxide, but alternatively other materials, such as titanium or a nitride, can also be used.

In this regard, frames 50, 60 can both be situated on first substrate 10 as well as on second substrate 20. It can alternatively be provided that the two frames 50, 60 be situated distributed on substrates 10, 20.

Figure 2:
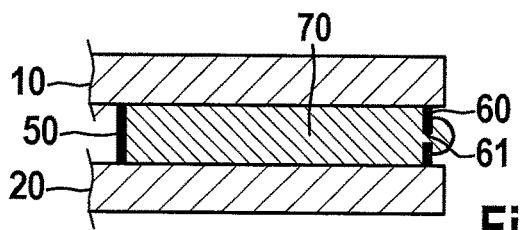
FIG. 2 shown the subsection of FIG. 1 after eutectic bonding has been carried out, according to an example embodiment of the present invention.
Figure 4:
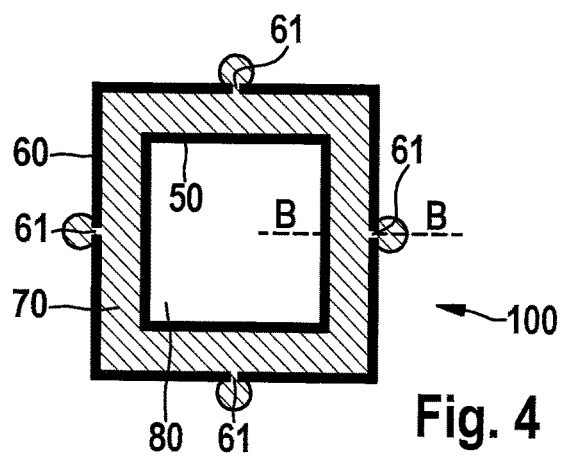
FIG. 4 a top view of the structure of FIG. 3 after eutectic bonding has been carried out, according to an example embodiment of the present invention.

FIG. 2 shows a cross sectional view along a section B-B of FIG. 4. What is shown is the structure of FIG. 1 after a eutectic wafer bonding process has been carried out, at which the two bonding layers 30, 40 or, rather, the eutectic alloys have been completely melted. One may recognize that therefore a volume between the two frames 50, 60 and substrates 10, 20 is filled up completely with liquid eutectic 70, excess liquid eutectic 70 being able to flow outwards ("bubble out") through an opening 61 provided in outer frame 60. As a result, eutectic 70 is formed uniformly laterally between the two substrates 10, 20 and makes possible, in this way, an especially well adhering connection between the two substrates 10, 20. In a subsequent construction process and connecting process, the exited and solidified eutectic 70 can be sawed off, whereby eutectic 70 is able to be removed in a simple manner.

FIG. 3 shows a top view of an example embodiment of apparatus 100, with eutectic 70 before merging, bonding layers 30, 40 not yet completely filling up the region between outer frame 60 and inner frame 50. A respective opening 61 is provide at each side of outer frame 60, with a good symmetry of the entire system. However, it is also conceivable that openings 61 are present in larger numbers and/or distributed irregularly over the outer frame 60. A number of openings 61 preferably depends, in this case, on the extension of the entire bonding frame, where, the longer the bonding frame, the more openings 61 being provided. As a minimum requirement for the specified flowing off of eutectic 70, it may be regarded that one should position at least one opening 61 on at least one outer side of an outer frame 60.

FIG. 4 shows a state of the structure of FIG. 3 after the eutectic wafer bonding process, according to an example embodiment. Inner frame 50 prevents excess eutectic 70 from flowing into inner cavity 80 (such as a cavity of a micromechanical component), whereby cavity 80 is protected from exiting eutectic 70. FIG. 4 shows that, at each opening 61, some bubbled-out eutectic 70 has formed which, as was described above, can be removed again in the solidified state, in a simple manner.

Figure 5:
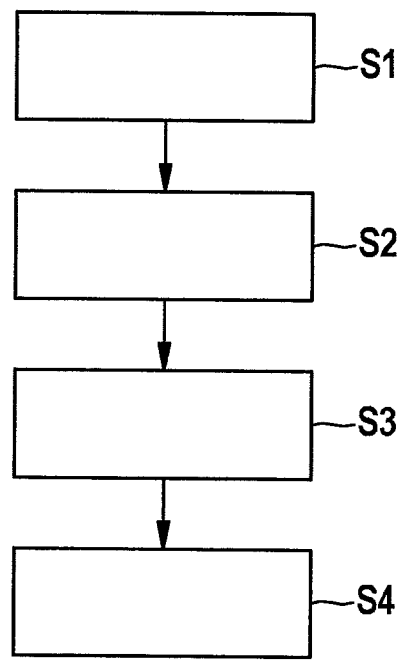
FIG. 5 is a flowchart that illustrates a method according to an example embodiment of the present invention.

FIG. 5 is a flowchart of a method according to an embodiment of the present invention. In a first step S1, a first bonding layer 30 is applied on a first substrate 10. In a second step S2, a second bonding layer 40 is applied on a second substrate 20, at least one of substrates 10, 20 including a frame device 50, 60, which encloses bonding layers 30, 40. In a third step S3, substrate composite 10, 20, 30, 40, 50, 60 are heated above the eutectic temperature. In a fourth step S4, a mechanical contact pressure is exerted on the substrate composite in such a way that a volume formed by frame device 50, 60 and substrates 10, 20 is completely filled up with eutectic 70.

Figure 6:
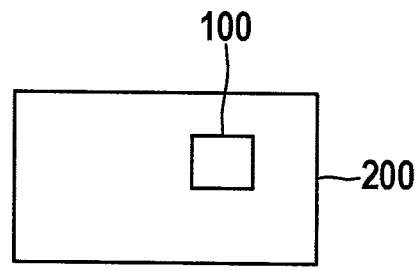
FIG. 6 a block diagram of a micromechanical component including an apparatus according to an example embodiment of the present invention.

FIG. 6 is block diagram of an electronic component 200 that includes an apparatus 100 for eutectic bonding, according to an example embodiment. In this context, component 200 can be developed as any micromechanical sensor, for instance, an inertial sensor, such as rotation-rate sensor, an acceleration sensor, etc. An application of apparatus 100 for static and resonant micromirrors is also conceivable.

In summary, in using the present invention, an apparatus is provided for eutectic bonding or joining, using which, a defined, spatially limited extension of liquid eutectic is possible during the bonding. The apparatus according to the present invention is advantageously suitable for any electronic component that includes two substrates.

Although the present invention has been described with the aid of specific example embodiments, it is by no means limited to those specific example embodiments. One skilled in the art will thus suitably modify or combine with one another the described features without deviating from the essence of the present invention.

What is claimed is:

1. An apparatus for eutectic bonding, comprising:
   a bonding frame that includes two substrates;
   a frame device situated on the substrates, the frame device including two frames, wherein the two frames include an inner frame and an outer frame, the two frames together with the substrates, define a volume;
   and a eutectic, formed during the bonding, which fills the volume;
   wherein the outer frame includes at least one opening on at least one outer side of the outer frame for outflow of the eutectic, and
   wherein a diameter of the openings is less than or equal to ca. 20 µm.

2. The apparatus of claim 1, wherein the frames are shorter than a combined height of bonding layers that form the eutectic.

3. The apparatus of claim 1, wherein a diameter of the openings is ca. 10 μm to ca. 20 μm.

4. The apparatus of claim 1, wherein the outer frame includes at least one opening on each of a plurality of outer sides of the outer frame for outflow of the eutectic.

5. The apparatus of claim 1, wherein the outer frame includes at least one opening on each of all outer sides of the outer frame for outflow of the eutectic.

6. The apparatus of claim 1, wherein the inner frame is fluid-tight to the eutectic.

7. The apparatus of claim 1, wherein the frames are formed from one of the following materials: an oxide, a nitride, and titanium.

8. A micromechanical component comprising:
an apparatus for eutectic bonding, the apparatus including:
a bonding frame that includes two substrates;
a frame device situated on the substrates, the frame device including two frames, wherein the two frames include an inner frame and an outer frame, the two frames together with the substrates, define a volume;
and a eutectic, formed during the bonding, which fills the volume;
wherein the outer frame includes at least one opening on at least one outer side of the outer frame for outflow of the eutectic, and
wherein a diameter of the openings is less than or equal to ca. 20 μm.

* * * * *

UNITED STATES PATENT AND TRADEMARK OFFICE
CERTIFICATE OF CORRECTION

PATENT NO. : 9,935,077 B2  
APPLICATION NO. : 14/620952  
DATED : April 3, 2018  
INVENTOR(S) : Ralf Hausner et al.

Page 1 of 1

It is certified that error appears in the above-identified patent and that said Letters Patent is hereby corrected as shown below:

On the Title Page

Add the priority information as shown below:  
Item --(30) Foreign Application Priority Data:  
Feb. 17, 2014 (DE)........... 10 2014 202 817.5--.

Signed and Sealed this  
Nineteenth Day of June, 2018

Andrei Iancu  
*Director of the United States Patent and Trademark Office*